United States Patent
Akram (10) Patent No.: US 6,349,396 B2
(45) Date of Patent: *Feb. 19, 2002

(54) TESTING SYSTEM FOR EVALUATING INTEGRATED CIRCUITS, A BURN-IN TESTING SYSTEM, AND A METHOD FOR TESTING AN INTEGRATED CIRCUIT

(75) Inventor: Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/745,834

(22) Filed: Dec. 21, 2000

Related U.S. Application Data (63) Continuation of application No. 09/515,975, filed on Feb. 29, 2000, now Pat. No. 6,189,120, which is a continuation of application No. 09/009,973, filed on Jan. 21, 1998, now Pat. No. 6,119,255.

(51) Int. Cl.[7] .................................................. G01R 31/28

(52) U.S. Cl. ........................ 714/724; 714/734; 324/765

(58) Field of Search .................. 714/30, 724, 733–734, 714/742; 324/756, 158.1; 702/185, 188, 200; 235/492, 765, 760; 359/110; 340/10.5

(56) References Cited

U.S. PATENT DOCUMENTS

| | | |
|---|---|---|
| 3,689,885 A | 9/1972 | Kaplan et al. |
| 4,833,402 A | 5/1989 | Boegh-Petersen |
| 4,930,129 A | 5/1990 | Takahira |
| 4,962,485 A | 10/1990 | Kato et al. |
| 5,068,521 A | 11/1991 | Yamaguchi |
| 5,113,184 A | 5/1992 | Katayama |

(List continued on next page.)

OTHER PUBLICATIONS

LoVasco, et al.(Relative effectiveness of thermal cycling versus burn–in: a case study; IEEE, May 20 1992).*

A Study on Accelerated Preconditioning Test, Yesbeng Sun et al., 1997 IEEE, pp. 98–101.

On Wafer Burn–In Strategies For MCM DIE[1], Adit D. Singh, MCM '94 Proceedings, pp. 255–260.

A non–contacting probe for measurements on high frequency planar circuits, Osofsky et al., Microwave Symposium Digest, 1989, IEEE, pp. 823–825.

Relative Effectiveness of Thermal Cycling Versus Burn–In: A Case Study, F. LoVasco & K. Lo, Electronic Components and Technology Conference, 1992 Proceedings., 42nd, 7 pages.

*Primary Examiner*—Albert Decady
*Assistant Examiner*—Guy Lamarre
(74) *Attorney, Agent, or Firm*—Wells, St. John et al.

(57) ABSTRACT

A burn-in testing system for evaluating a circuit under test, the system including a burn-in board having a plurality of receptacles, at least one of which being sized to receive the circuit under test, test interface circuitry supported by the board and coupled to the receptacles, the test interface circuitry including a transmitter and receiver; power conductors supported by the board, coupled to the receptacles and configured to be connected to a power supply to power the circuit under test during burn-in testing, control and data signal conductors, a burn-in oven having a compartment selectively receiving the burn-in board and being configured to apply heat within the compartment, and an interrogator unit supported by the burn-in oven, the interrogator unit being configured to send commands to the test interface circuitry to exercise the circuit under test optically or via radio communication and to receive responses to the commands optically or via radio communication. A method for testing an integrated circuit having operational circuitry formed thereon, optically and via radio frequency.

54 Claims, 6 Drawing Sheets

U.S. PATENT DOCUMENTS

| | | |
|---|---|---|
| 5,148,103 A | 9/1992 | Pasiecznik, Jr. |
| 5,164,665 A | 11/1992 | Yamashita et al. |
| 5,182,442 A | 1/1993 | Takahira |
| 5,198,647 A | 3/1993 | Mizuta |
| 5,202,838 A | 4/1993 | Inoue |
| 5,212,373 A | 5/1993 | Fujioka et al. |
| 5,219,765 A | 6/1993 | Yoshida et al. |
| 5,220,158 A | 6/1993 | Takahira et al. |
| 5,226,167 A | 7/1993 | Yamaguchi |
| 5,252,914 A | 10/1993 | Bobbitt et al. |
| 5,274,221 A | 12/1993 | Matsubara |
| 5,303,199 A | 4/1994 | Ishihara et al. |
| 5,317,255 A | 5/1994 | Suyama et al. |
| 5,343,478 A | 8/1994 | James et al. |
| 5,448,110 A | 9/1995 | Tuttle et al. |
| 5,672,981 A | 9/1997 | Fehrman |
| 5,764,655 A | 6/1998 | Kirihata et al. |
| 5,801,432 A | 9/1998 | Rostoker et al. |
| 5,945,834 A | 8/1999 | Nakata et al. |
| 5,949,246 A | 9/1999 | Frankeny et al. |
| 5,953,688 A * | 9/1999 | Su et al. .................... 702/185 |
| 6,058,497 A | 5/2000 | Tuttle |
| 6,119,255 A | 9/2000 | Akram |
| 6,189,120 B1 * | 2/2001 | Akram .................... 714/724 |

* cited by examiner

TESTING SYSTEM FOR EVALUATING INTEGRATED CIRCUITS, A BURN-IN TESTING SYSTEM, AND A METHOD FOR TESTING AN INTEGRATED CIRCUIT

CROSS REFERENCE TO RELATED APPLICATION

This is a Continuation of U.S. patent application Ser. No. 09/515,975, filed Feb. 29, 2000, now U.S. Pat. No. 6,189, 120, entitled "A Testing System for Evaluating Integrated Circuits, A Burn-In Testing System, and a Method for Testing an Integrated Circuit", listing Salman Akram as inventor, which is a Continuation of U.S. patent application Ser. No. 09/009,973, filed Jan. 21, 1998, now U.S. Pat. No. 6,119,255.

TECHNICAL FIELD

This invention relates to systems for testing circuitry. More particularly, the invention relates to burn-in testing. The invention also relates to methods for conducting such tests.

BACKGROUND OF THE INVENTION

Processed semiconductor wafers typically comprise an array of substantially isolated integrated circuitry which are individually referred to as "die" or "chips." Some circuits are formed on boards, such as printed circuit boards, such as where the cost of designing and manufacturing an integrated circuit chip is too high relative to the size benefit. These chips or boards define various circuits for use in computers (e.g., video cards, sound cards, modem cards, etc.), televisions, telephone systems, and many other electronic devices. The chips or cards also define the finished circuitry components of, for example, processors and memory circuits. Common types of memory circuits are DRAM and SRAM chips.

After a semiconductor wafer has been fabricated, not all chips provided on the wafer prove operable, typically resulting in less than 100% yield. Accordingly, individual dies must be tested for functionality. The typical test procedure for DRAM or SRAM circuitry is to first access the device via bonding pads on the individual die. Thereafter, the wafer is subjected to test probing whereby the individual die are tested for satisfactory operation. Inoperable die are typically marked by an ink mark. After testing, the wafer is cut into individual die. The operable, non-marked die are collected.

The operable individual die are then assembled in final packages of either ceramic or plastic to define a packaged integrated circuit or device. After packaging, the integrated circuits are loaded into burn-in boards which comprise printed circuit boards having individual sockets. The burn-in boards are placed into a burn-in oven, and the parts are subjected to burn-in testing during which the die are operated for a period of time at different temperature cycles, including higher than operating temperatures. The dies are stressed to accelerate their lives in an effort to identify the weak die which are likely to degrade and fail under these tests. Manufacturers predict early failures, known as "infant mortalities", to occur within a predetermined period of time of the burn-in cycle. Burn-in testing is typically conducted for a period of time sufficient to reveal these infant mortalities. For example, if infant mortalities are expected to occur within twenty-four or forty-eight hours of burn-in testing, the burn-in tests can be completed within such time periods. In this manner, semiconductor wafer manufacturers can effectively test the quality of their integrated circuits in a reasonable time frame prior to shipping the integrated circuits to consumers.

More particularly, the failure rate for a semiconductor device as a function of time generally follows what is known as a "bathtub-type curve". The initial or infant mortality failure rate for die is very high at the start, and flattens out to near zero during a mid-time period, such as from one month through a period of 10 to 12 years, and then goes back up. In other words, if the integrated circuit survives the first one to five months or so of operation, it is highly probable that it will provide flawless operation through the tenth or twelfth year. Thereafter, usually after the expected lifetime of the device, material or other changes in the die cause the failure rate to increase exponentially, thus providing the bathtub shaped curve.

Burn-in testing can be conducted in either what is known as the static method or by a dynamic method. In both, the packaged die is electrically stressed under elevated temperature (e.g., 125° C.) for a given period of time (e.g., 24 hours) sufficient to test the die. Under a static electrical test, the die is subjected to an operating voltage that is much higher than the normal operating voltage. For example, the $V_{cc}$ node of the die may be subjected to an operating voltage of seven volts instead of the normal $V_{cc}$ voltage of three to five volts, while the $V_{ss}$ node of the die is held at ground. Operability is determined at the end of the test.

Under dynamic testing, individual devices are exercised on and off throughout the burn-in period, and the die is constantly monitored. Operability is determined during the test.

On a burn-in board, several receptacles are provided on a burn-in board (e.g., two feet by three feet in size), and the individual packages are received. Wiring extends from these individual receptacles/devices to one edge of the board where they connect outwardly to the testing and intelligence cycling circuitry. These long lengths of line create undesired parasitics such as unwanted noise, capacitance, resistance, inductance and crosstalk.

As described above, the die are subjected to a preliminary wafer-level test before sawing into individual die, and a burn-in test after separating and packaging of the individual die. Each of these two separate tests require some physical connection with a testing apparatus. During the wafer-level test probes are employed to directly contact bonding pads. During the burn-in testing, each individual chip is inserted into a socket on a burn-in board for the test.

Attention is directed to commonly assigned U.S. patent application Ser. No. 07/979,607, filed Nov. 20, 1992, titled "Testing and Burn-In of IC chips Using Radio Frequency Transmission," which is incorporated herein by reference.

SUMMARY OF THE INVENTION

The invention provides a system and method for preliminary wafer-level testing and burn-in testing without physically contacting the semiconductor wafer or individual die.

In accordance with one aspect of the invention, a contactless method of burn-in testing semiconductor devices is provided wherein a burn-in board is equipped with an RF transmitter/receiver. Another transmitter/receiver is provided remote of a burn-in furnace such that test logic can be sent via radio frequency to each individual burn-in board during burn-in tests. The burn-in board has separate power lines for the $V_{cc}$ and $V_{ss}$ node connections to the respective semiconductor devices.

One aspect of the invention provides a burn-in testing method and system for evaluating a circuit under test. A burn-in board has a plurality of receptacles. At least one of the receptacles is sized to receive the circuit under test. Test interface circuitry is supported by the board and coupled to the receptacles. The test interface circuitry includes a transmitter and receiver. Power conductors are supported by the board, coupled to the receptacles and configured to be connected to a power supply to power the circuit under test during burn-in testing. A burn-in oven has a compartment selectively receiving the burn-in board and being configured to apply heat within the compartment. An interrogator unit has a radio communication range extending to the test interface circuitry. The interrogator unit is configured to send commands to the test interface circuitry to exercise the circuit under test via radio communication and to receive responses to the commands via radio communication.

In one aspect of the invention, the test interface circuitry is mounted to the board. The power conductors comprise conductive traces formed on the board. Conductive traces formed on the board couple the receptacles to the test interface circuitry.

In one aspect of the invention, the interrogator unit is configured to provide an identification code as part of the interrogating information. The test interface circuitry includes ID labels assigned to respective receptacles, and the test interface circuitry is configured to compare the identification code provided by the interrogator unit with the ID label of the receptacle for the circuit under test, the test interface circuitry being configured to test cycle the operational circuitry when the identification code matches the ID label. The test interface circuitry is separately coupled to the respective receptacles such that the interrogator, in communication with the test interface circuitry, can select a receptacle, and thereby select a desired one of a plurality of circuits under test, for test cycling.

In one aspect of the invention, the receptacles respectively comprise sockets sized to receive an integrated circuit.

In one aspect of the invention, the testing system is configured to perform dynamic testing. In dynamic testing, the circuitry being tested is cycled on and off during a period of time. For example, the period of time may be greater than twelve hours. More particularly, the period of time may be both greater than twelve hours and less than 36 hours. In one aspect, during the dynamic testing, the oven heats the chamber to a temperature greater than 100 degrees Celsius.

In one aspect of the invention, the testing system is configured to perform static testing.

In one aspect of the invention, the power conductors extend at least partially along the board. In one aspect, the burn-in oven includes a power source accessible from the chamber, and the power conductors are removably coupled to the power source. The power source is configured to supply to the circuit under test a voltage higher than the normal operating voltage of the circuit under test.

In an alternative embodiment, the test logic is sent to the burn-in board by light. More particularly, a testing system comprises a burn-in oven defining a chamber, and an interrogator unit having an optical transmitter directed into the chamber. The optical transmitter has an optical communication range. The interrogator unit is configured to optically transmit interrogating information into the chamber. A burn-in board is selectively received within the chamber, remotely from the interrogator unit, but within the optical communication range. The burn-in board includes a plurality of receptacles sized to receive respective circuits under test. The burn-in board has an optical receiver configured to communicate with the transmitter.

One aspect of the invention provides a method for testing an integrated circuit having operational circuitry. A burn-in board is provided having a plurality of receptacles configured to receive integrated circuits and to electrically interface with the operational circuitry in the integrated circuits. Test interface circuitry is formed on the burn-in board, electrically coupled to the receptacles. An interrogator unit is provided, and the burn-in board is located remotely from the interrogator unit. The integrated circuit is placed in one of the receptacles. Power is supplied to the operational circuitry and the test interface circuitry. Interrogating information is coupled to from the interrogator unit to the test interface circuitry on the burn-in board via radio communication.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
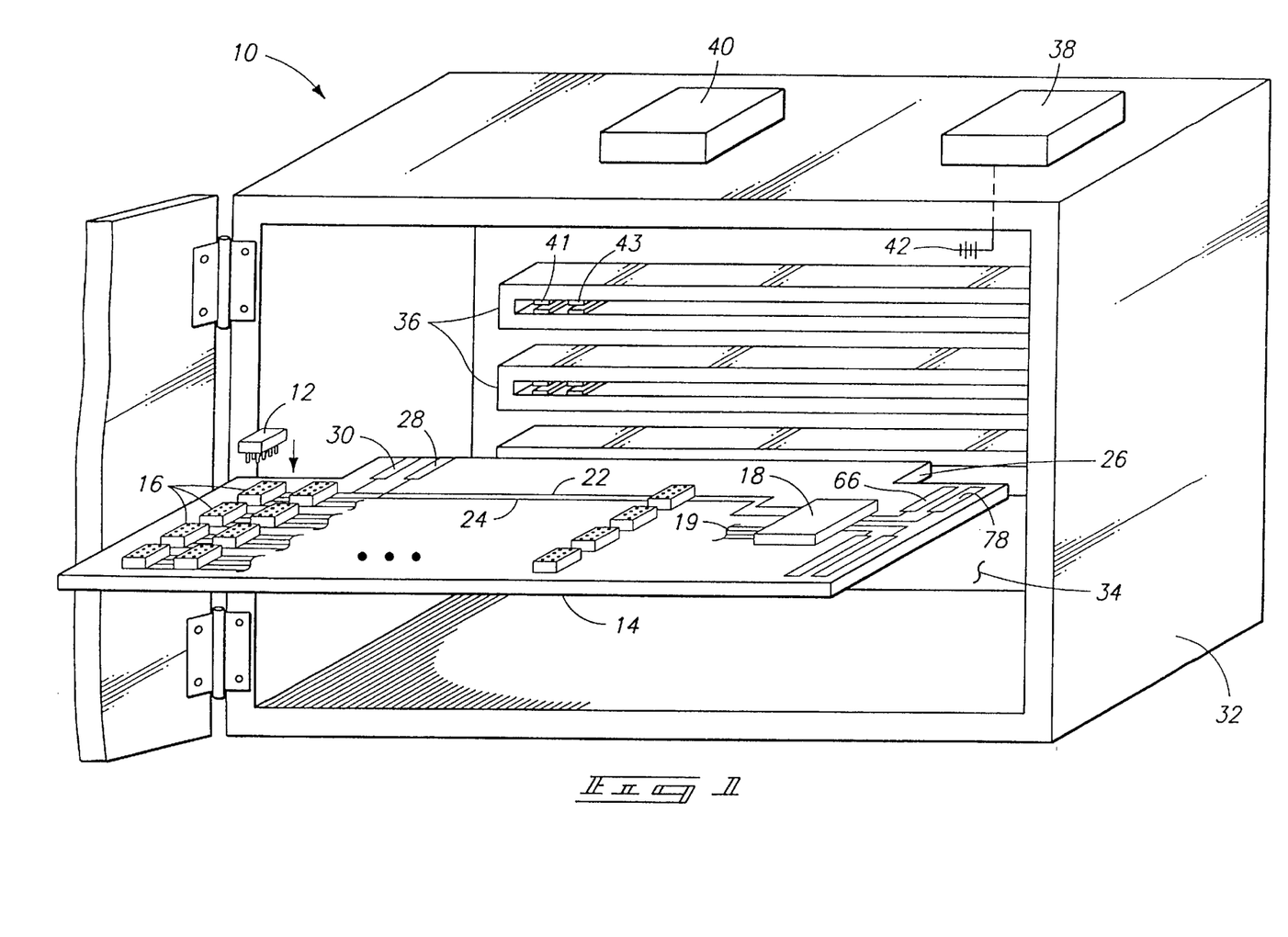
FIG. 1 is a perspective view of a testing system according to one aspect of the present invention.

FIG. 1 diagrammatically illustrates a testing system 10 according to one embodiment of this invention. The testing system of this invention can be used to test multiple devices or circuits under test 12, such as circuit cards or integrated circuits (ICs), at the same time. In the illustrated embodiment, the term "integrated circuit" is defined as including a package, a chip in the package having circuitry, and pins extending from the package and being connected to the circuitry. The devices under test 12 include operational circuitry which comprises the components and elements for performing functions which the integrated circuit is designed to perform. For example, if the integrated circuit is a RAM or ROM integrated circuit, the operational circuitry comprises the memory cells, the circuitry for selecting a particular cell for reading or writing, and other circuitry typically found in a RAM or ROM.

In the embodiment shown in FIG. 1, the testing system 10 employs radio communication with a transponder on a burn-in board to interrogate individual integrated circuits without physically contacting them.

The testing system 10 includes one or more substantially identical burn-in boards 14. For purposes of simplicity, only one such board will be described. The board 14 shown in FIG. 1 has a plurality of receptacles 16. The receptacles 16 are sized to receive the devices under test 12. In one embodiment, the board 14 has a plurality of rows and columns of receptacles sized to receive integrated circuits.

Figure 3:
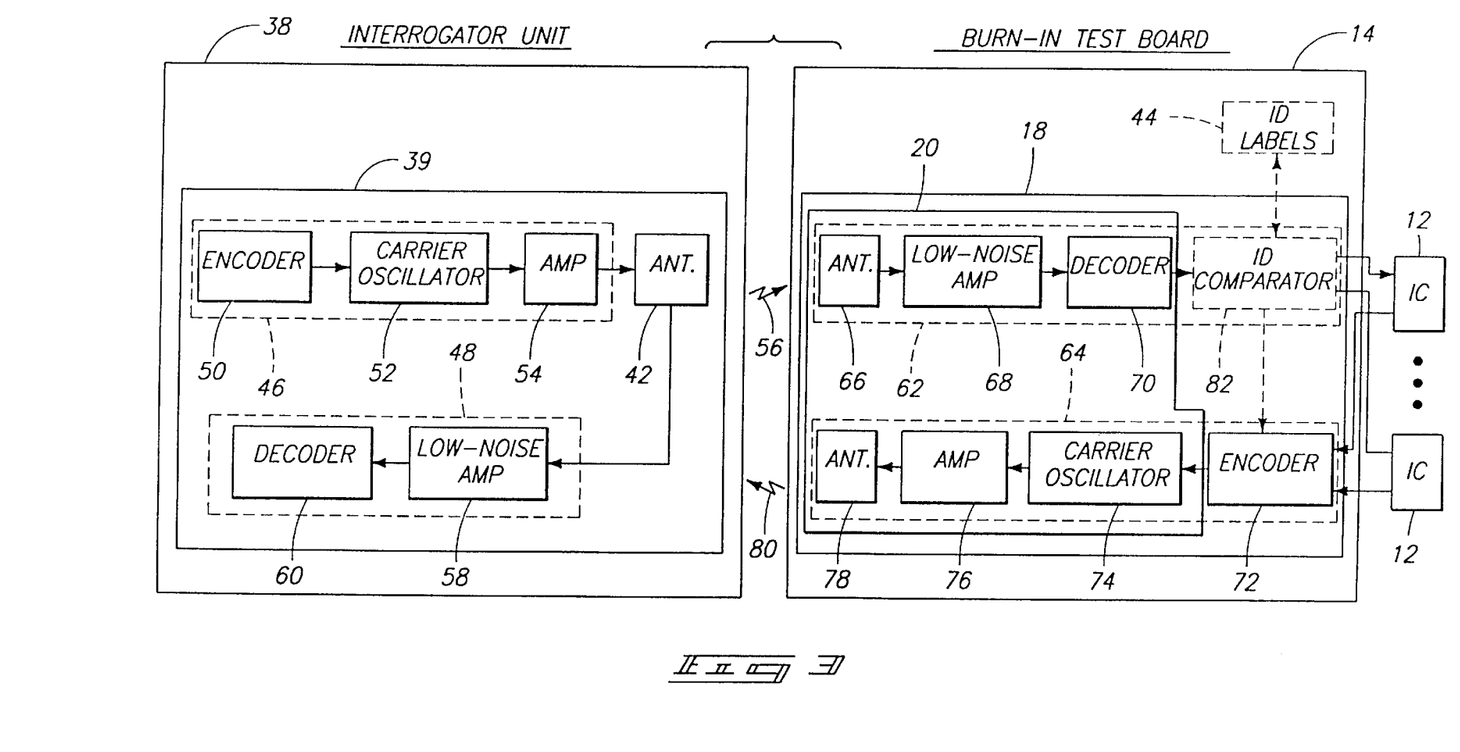
FIG. 3 is a block diagram of electrical components of the testing system of FIG. 1.

The testing system 10 further includes test interface circuitry 18 electrically coupled to the receptacles 16. In the embodiment of FIGS. 1 and 3, the test interface circuitry is supported by (e.g., mounted to) the respective boards 14. In one alternative embodiment, the test interface circuitry is included in the devices under test 12. The system includes conductive traces 19 formed on the board electrically coupling the receptacles 16 to the test interface circuitry 18. The test interface circuitry 18 includes a transponder 20 (FIG. 3) defined by a transmitter and receiver. In the illustrated embodiment, the test interface circuitry 18 is defined by an integrated circuit mounted to the board 14. In one embodiment (not shown), the transponder 20 is defined by an integrated circuit separate from the rest of the test interface circuitry.

The testing system 10 further includes power conductors 22 and 24 supported by the board, and coupled to the receptacles 16. The power conductors are connected to a power supply to power the devices under test 12 during burn-in testing. The power conductors 22 and 24 comprise conductive traces formed on the board. The testing system 10 further includes control and data conductors 19 supported by the board 14, and coupled to the receptacles 16. The conductors 19 provide control signals and data communication between the test interface circuitry 18 and the devices 12 via the receptacles 16. More particularly, in one embodiment, the burn-in board 14 includes an edge connector 26 having electrical contacts 28 and 30, and the power conductors 22 and 24 extend from the contacts 28 and 30, respectively.

The testing system 10 further includes a burn-in oven 32. The burn-in oven 32 has a compartment 34 selectively receiving the burn-in board 14. More particularly, in the illustrated embodiment, the burn-in oven 32 includes edge connector receptacles 36 respectively slidably receiving edge connectors 26 of burn-in boards 14. The burn-in oven 32 applies heat within the compartment 34 to heat the devices under test 12 during burn-in testing. The temperature to which the oven heats the chamber is adjustable. In one embodiment, during burn-in testing, the oven heats the chamber to a temperature greater than 100 degrees Celsius. In one embodiment, burn-in testing is conducted at a temperature of approximately 125 degrees Celsius.

The burn-in oven includes an adjustable voltage power source 40 (e.g., an AC to DC converter) accessible from the chamber. The power conductors on the card are removably coupled to the power source. More particularly, the edge connector receptacles 36 include Vcc and Vss power connections 41 and 43 which engage the contacts 28 and 30 on the card when the card is received, and which are coupled to the power source 40.

The system 10 further includes an interrogator unit 38. In the illustrated embodiment, the interrogator unit 38 is supported by the burn-in oven 32, or is remote from the compartment 34. In operation, the interrogator unit 38 sends commands to the test interface circuitry 18 to exercise the devices under test 12 via radio communication and receives responses to the commands via radio communication. In the illustrated embodiment, the interrogator unit 38 is defined by a computer (such as a work station or PC) fitted with an RF communication circuit board or transponder 39 (FIG. 3). The computer is programmed to conduct the various tests on the integrated circuits. The tests performed can be the same tests performed in conventional burn-in testing systems.

The testing system further includes an antenna 42 coupled to the interrogator unit 38 and mounted for radio frequency communications within the compartment 34. In the illustrated embodiment, the antenna 42 is supported by the burn-in oven 32 and is located within the compartment 34. The interrogator unit 38, when coupled to the antenna 42, has a radio communication range extending to the test interface circuitry 18. The interrogator unit 38 transmits data information via the antenna 42 to test the devices under test 12. In this manner, the testing system 10 can evaluate devices under test 12 positioned remotely from interrogator unit 38, but within the radio communication range. Such contactless testing eliminates mechanical probes or other test equipment which require physically contacting the individual devices under test 12. In the illustrated embodiment, the interrogator unit 38 is positioned outside of the compartment 34 and is electrically coupled to the antenna 42 which is within the compartment 34. In an alternative embodiment, however, the interrogator unit 38 is positioned in the chamber, and is defined by a circuit board or electronic component mounted in the chamber.

In operation, the interrogator unit 38 provides an identification code as part of the interrogating information. The test interface circuitry 18 includes ID labels 44 (FIG. 3) identifying receptacles 16 (e.g., in a RAM, or in ROM, such as in a ROM lookup table). In operation, the test interface circuitry 18 compares the identification code provided by the interrogator unit 38 with the ID labels 44 of the various receptacles 16. The test interface circuitry 18 test cycles the operational circuitry of a device under test 12 when the identification code provided by the interrogator unit 38 matches the ID label for the receptacle 16 in which the device under test 12 is received. The test interface circuitry 18 is separately coupled to the respective receptacles 16 such that the interrogator unit 38, in communication with the test interface circuitry 18, can select a receptacle. By selecting a receptacle 16, the test interface circuitry 18 thereby selects a desired one of a plurality of devices under test 12 for test cycling. In an alternative embodiment, respective devices under test 12 being tested include electronic ID labels, and the test interface circuitry test cycles the operational circuitry of an integrated circuit when the identification code provided by the interrogator matches the ID label for the devices under test 12 being tested.

In the illustrated embodiment, the testing system 10 is used to perform dynamic testing. In dynamic testing, the device under test 12 being tested is cycled on and off during a period of time. For example, the period of time may be greater than twelve hours. More particularly, the period of time may be both greater than twelve hours and less than thirty-six hours.

In another embodiment, the testing system 10 is used to perform static testing. In static testing, the power source 40 applies a voltage to respective devices under test 12 that is higher than the normal operating voltage of the devices under test 12.

Figure 2:
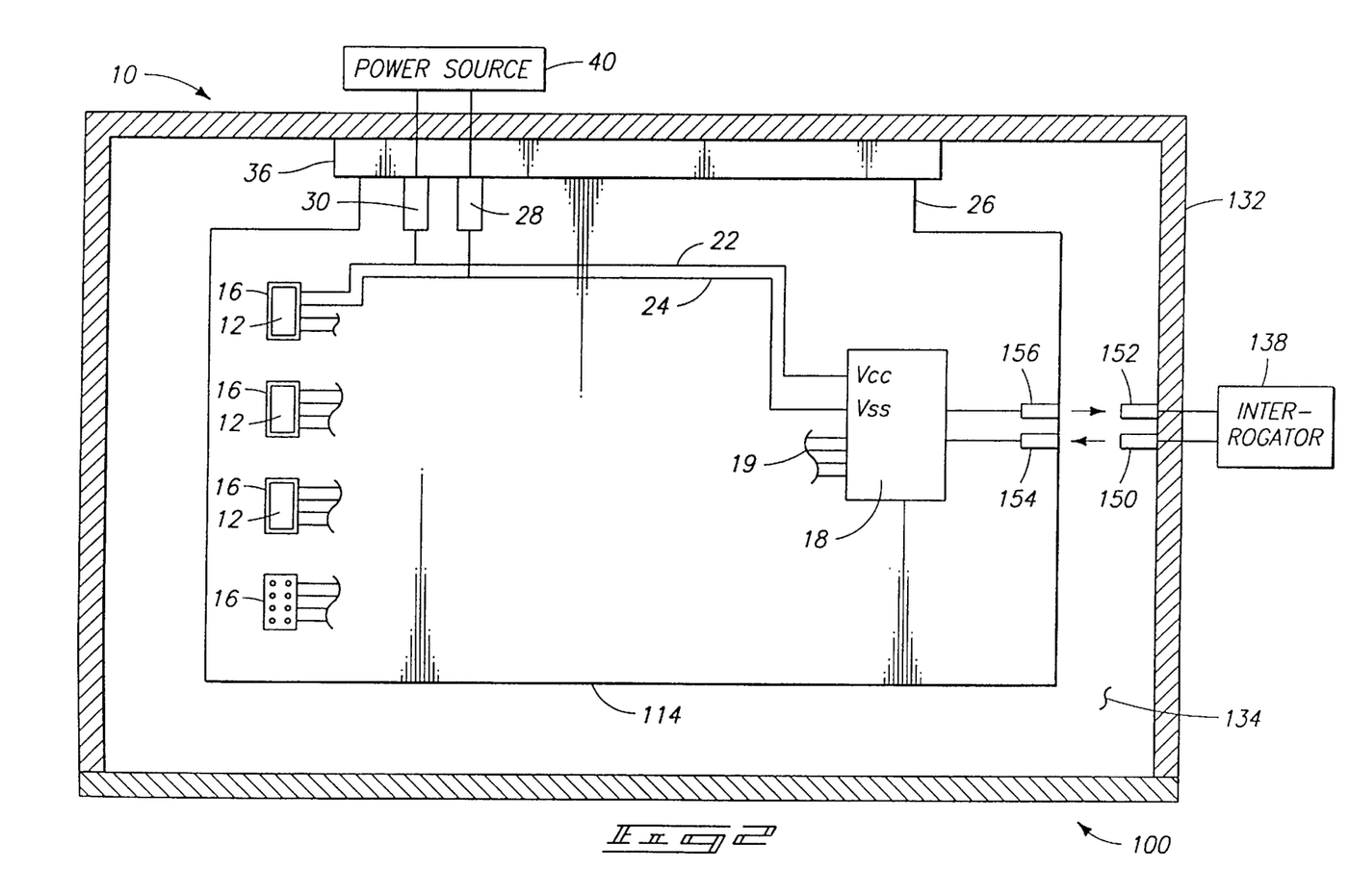
FIG. 2 is a plan view of a testing system according to another aspect of this invention.

FIG. 2 shows an alternative testing system 100 which is similar to the testing system 10, like reference numerals indicating like components, except that optical communications are employed. In the embodiment shown in FIG. 2, the test logic is sent to the burn-in board by light.

More particularly, the testing system 100 comprises a burn-in oven 132 defining a compartment 134, and an interrogator unit 138 having an optical transmitter 150 directed into the compartment 134 and an optical receiver 152. The optical transmitter 150 has an optical communication range. The interrogator unit 138 is configured to optically transmit interrogating information into the compartment 134. A burn-in board 114 is selectively received within the compartment 134, remotely from the interrogator unit 138, but within the optical communication range. The burn-in board 114 includes a plurality of receptacles 16 sized to receive respective devices under test 12. The burn-in board 114 has an optical receiver 154 mounted facing the optical transmitter 150 to receive burn-in test commands from the optical transmitter 150 and an optical transmitter 156 mounted facing the optical receiver 152 to transmit the results of burn-in test commands.

In the illustrated embodiment, one or both of the optical transmitter 150 and the optical transmitter 156 are light emitting diodes, or laser light emitting diodes. In the illustrated embodiment, one or both of the optical receivers 154 and 152 are photodiodes, avalanche photodiodes or other photodetectors.

In the illustrated embodiment, the transmission medium for communications between the optical transmitter 156 and the optical receiver 152 is air, and the transmission medium for communications between the optical transmitter 150 and the optical receiver 154 is air. In an alternative embodiment, an optical fiber is used to couple the optical transmitter 156 to the optical receiver 152 and/or an optical fiber is used to couple the optical transmitter 150 and the optical receiver 154. In the illustrated embodiment, the optical transmitters 150 and 156 respectively comprises a light emitting diode (LED) or a laser light emitting diode. In the illustrated embodiment, the optical receivers 152 and 154 respectively comprises photodiodes, avalanche photodiodes, or other photodetectors.

In one embodiment, respective devices under test 12 include an optical transmitter 156 and an optical receiver 154. In this embodiment, multiple transmitters 150 and receivers 152 are coupled to the interrogator 138 and communicate with respective optical transmitters 156 and optical receivers 154 of the devices under test 12 via a transmission medium which can include optical fibers and/or air.

In the illustrated embodiment, the testing system 100 is used to perform dynamic testing. In dynamic testing, the device under test 12 being tested is cycled on and off during a period of time. For example, the period of time may be greater than twelve hours. More particularly, the period of time may be both greater than twelve hours and less than thirty-six hours.

In another embodiment, the testing system 100 is used to perform static testing. In static testing, the power source 40 applies a voltage to respective devices under test 12 that is higher than the normal operating voltage of the devices under test 12.

FIG. 3 is a block diagram showing construction details of the interrogator unit 38 and the burn-in board 14 of FIG. 1 according to one embodiment of this invention.

The interrogator unit 38 includes a data transmitter 46, which transmits test data to the test interface circuitry 18 of the burn-in board 14, and a data receiver 48, which receives information indicative of the test results from the test interface circuitry 18. The data transmitter 46 includes an encoder 50, a carrier oscillator 52 coupled to the encoder, and an amplifier 54 coupled to the carrier oscillator 52 and to the antenna 42. The encoder 50 converts desired testing instructions into a compatible data format of serial bits which are then applied to a carrier generated by the oscillator 52, and transmitted as an interrogating information signal (represented as arrow 56) to the burn-in board 14. The information provided by the encoder 50 may also contain an identification code for selecting a specific device under test 12 or a specific group of devices under test.

The receiver 48 includes a low-noise amplifier 58 coupled to the antenna 42, and a decoder 60. The transponder 39 transmits interrogating information via radio communication to the burn-in test board, and thus to devices under test 12, and receives test data via radio communication from the burn-in test board.

The test interface circuitry 18 includes a data receiver 62 which receives the interrogating information 56 from the interrogation unit 38, and includes a data transmitter 64 which transmits test results back to the interrogation unit 38. The test interface circuitry 18 includes a receive antenna 66 and a transmit antenna 78 supported by the burn-in board 14. In one embodiment, the transmit antenna 78 and the receive antenna 66 are defined by microstrips on the burn-in board 14. The data receiver 62 has a low-noise amplifier 68 coupled to the receive antenna 66, and a decoder 70 coupled to the low noise amplifier 68. The interrogating information 64 is received via the antenna 66, amplified by the amplifier 68, and then decoded in the decoder 70. This information is then passed to operational circuitry in the selected device under test 12 to test cycle the device under test 12.

Results from the test cycling indicative of normal operation or of a potential defect of the device under test 12 are returned from the device under test 12 to the data transmitter 64. The data transmitter 64 includes an encoder 72 which encodes the test data results in a format compatible with the interrogator unit 38, a carrier oscillator 74 coupled to the encoder 72, and an amplifier 76 coupled to the oscillator 72 and to the antenna 78. A test data signal (represented by arrow 80) is transmitted back to the interrogator unit 38 via radio communication. The test result information is then examined at the interrogator unit 38 to determine whether the tested device under test 12 has a defect, or operates properly. The interrogator unit 38 can be equipped with special logic circuitry to evaluate the test results. Alternatively, the interrogator unit can be connected to a data processing computer which examines the test results.

According to another aspect of this invention, an identification tag system can also be formed on respective devices under test 12, or the receptacles can be given labels 44, stored by the test interface circuitry 18, to discriminate against incoming interrogating information. If identification tags are formed on the integrated circuits, respective devices under test 12 include an identification tag which contains a unique identification label which is set during manufacturing by electrical fuses, laser fuses, masked programming, or the like. Alternatively, receptacles 16 (FIG. 1) are assigned identification labels by the test interface circuitry 18.

In such embodiments, the burn-in board 14 includes an identification comparator 82 coupled between the decoder 70 and the devices under test 12 to determine whether the interrogating information transmitted by the interrogator unit 38 is directed to the specific device under test 12. The interrogating information transmitted via the signal 56 contains an identification code which is compared to the identification label 44. If the identification comparator 82 determines that the code matches the label, the identification comparator 82 passes the test information to the specified device under test 12 (or specified group of devices under test 12) for test cycling procedures. On the other hand, if the identification code does not match the identification label, the comparator 82 blocks the interrogating information. In this manner, interrogator unit 38 can discriminate among numerous integrated circuits to conduct specific test procedures on identifiable individual or classes (groups) of integrated circuits.

The block diagram of FIG. 3 illustrates basic well known components for description purposes. Some of these depicted components or circuits can easily be combined as one component. For example, in one embodiment, separate send and receive antennas are employed by the interrogator unit 38. In one embodiment, only one antenna is used by the test interface circuitry 18 to both send and receive. Encoding and decoding functions may also be accomplished using an integrated component.

In one embodiment, spread spectrum techniques may be used to facilitate RF communication.

Figure 4:
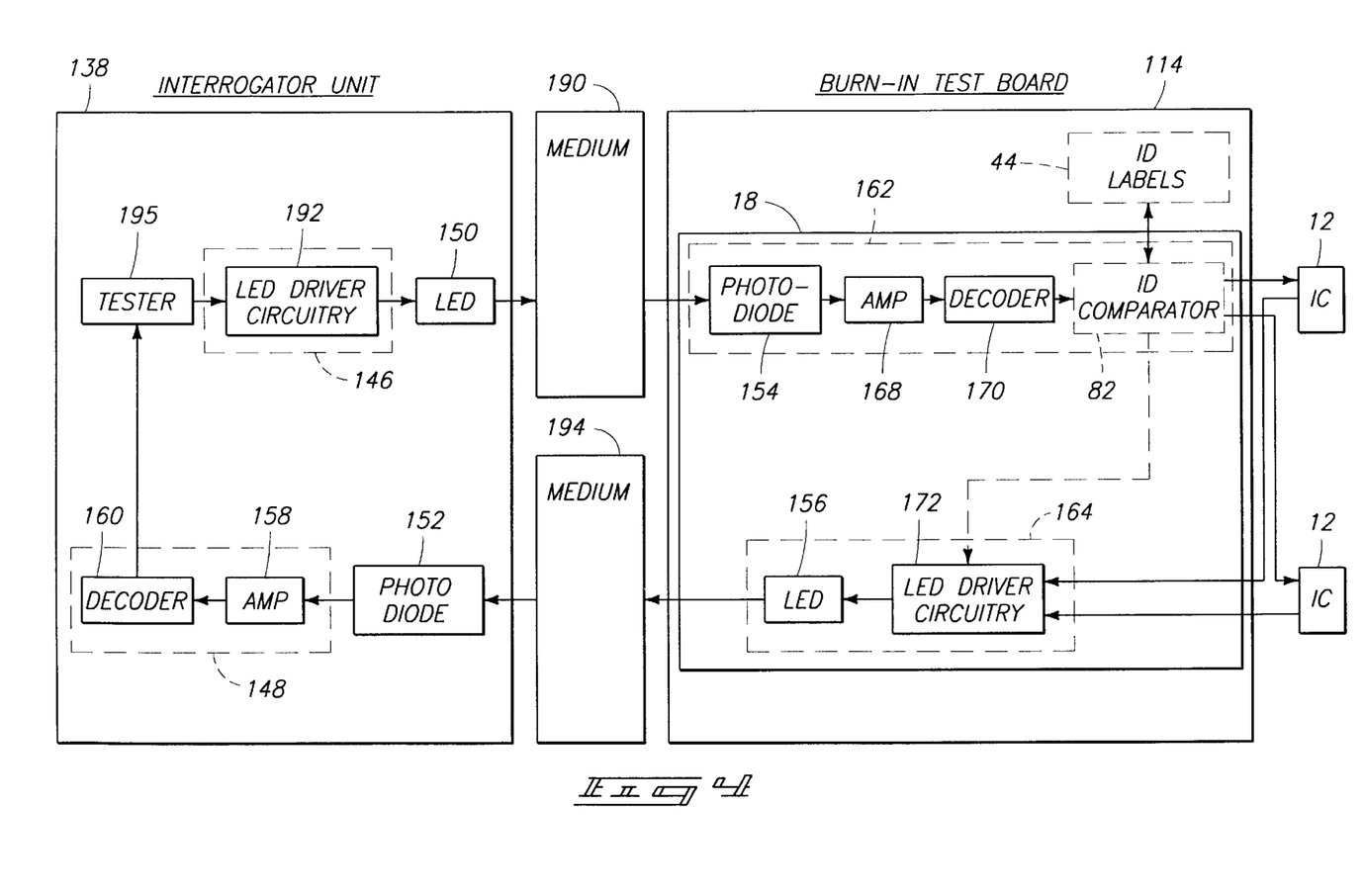
FIG. 4 is a block diagram of electrical components of the testing system of FIG. 2.

FIG. 4 is a block diagram showing construction details of the interrogator unit 138 and the burn-in board 114 of FIG. 3 according to one embodiment of this invention.

The interrogator unit 138 includes a data transmitter 146, which transmits test data to the test interface circuitry 18 of the burn-in board 114, and a data receiver 148, which receives information indicative of the test results from the test interface circuitry 18. The data transmitter 146 includes LED driver circuitry 192 for controlling the light emitting diode 150. The driver circuitry 192 converts desired testing instructions into an conventional optical data format and transmitted as an interrogating information signal to the burn board 114 via a transmission medium 190. In one embodiment, the transmission medium 190 is air. In another embodiment, the transmission medium 190 comprises a fiber optic cable. In embodiments employing fiber optic cables, appropriate connectors are employed. The information provided by the driver circuitry 146 may also contain an identification code for selecting a specific device under test 12 or a specific group of devices under test.

The interrogator unit 138 includes a receiver 148. The receiver includes an amplifier 158 coupled to the photodiode 152, and a decoder 160. The interrogator unit 138 transmits interrogating information optically to the burn-in test board, and thus to devices under test 12, and receives test data optically from the burn-in test board.

The test interface circuitry 18 includes a data receiver 162 which receives the interrogating information from the interrogation unit 138, and includes a data transmitter 164 which transmits test results back to the interrogation unit 138. The test interface circuitry 18 includes the optical receiver or photodiode 154 and the optical transmitter or LED 156, both supported by the burn-in board 114. The data receiver 162 has an amplifier 168 coupled to the photodiode 154, and a decoder 170 coupled to the amplifier 168. In one embodiment, the amplifier 168 includes both a preamplifier and a power amplifier. The decoder includes detector electronics for converting information received by the photodiode to usable digital signals. The interrogating information is received via the photodiode 154, amplified by the amplifier 168, and then decoded in the decoder 170. This information is then passed to operational circuitry in the selected device under test 12, via one of the receptacles 16 (FIG. 2) on the burn-in test board, to test cycle the device under test 12.

Results from the test cycling indicative of normal operation or of a potential defect of the device under test 12 are returned from the device under test 12 to the data transmitter 164. The data transmitter 164 includes LED driver circuitry 172 coupled to the LED 156. The LED driver circuitry 172 encodes the test data results for optical transmission. A test data signal is transmitted back to the interrogator unit 138 via a medium 194. In one embodiment, the medium 194 is air. In another embodiment, the medium 194 comprises fiber optic cable. The test result information is then examined at the interrogator unit 138 by tester 195 (e.g., a computer) to determine whether the tested device 12 has a defect, or operates properly.

In one embodiment, the optical information supplied from the LED 150 to the photodiode 154 includes intelligence, so that a minimum amount of logic is required to be included in the decoder 170.

According to one aspect of this invention, an identification tag system can also be formed on respective devices under test 12, or the receptacles can be given labels 44, stored by the test interface circuitry 18, to discriminate against incoming interrogating information in the manner described above. If identification tags are formed on the integrated circuits, respective devices under test 12 include an identification tag which contains a unique identification label which is set during manufacturing by electrical fuses, laser fuses, masked programming, or the like. Alternatively, receptacles 16 (FIG. 2) are assigned identification labels by the test interface circuitry 18.

In such embodiments, the burn-in board 114 (FIG. 4) includes an identification comparator 82 coupled between the decoder 170 and the devices under test 12 to determine whether the interrogating information transmitted by the interrogator unit 138 is directed to the specific device under test 12. The interrogating information contains an identification code which is compared to the identification label 44. If the identification comparator 82 determines that the code matches the label, the identification comparator 82 passes the test information to the specified device under test 12 (or specified group of devices under test 12) for test cycling procedures. On the other hand, if the identification code does not match the identification label, the comparator 82 blocks the interrogating information. In this manner, interrogator unit 138 can discriminate among numerous integrated circuits to conduct specific test procedures on identifiable individual or classes (groups) of integrated circuits.

Figure 5:
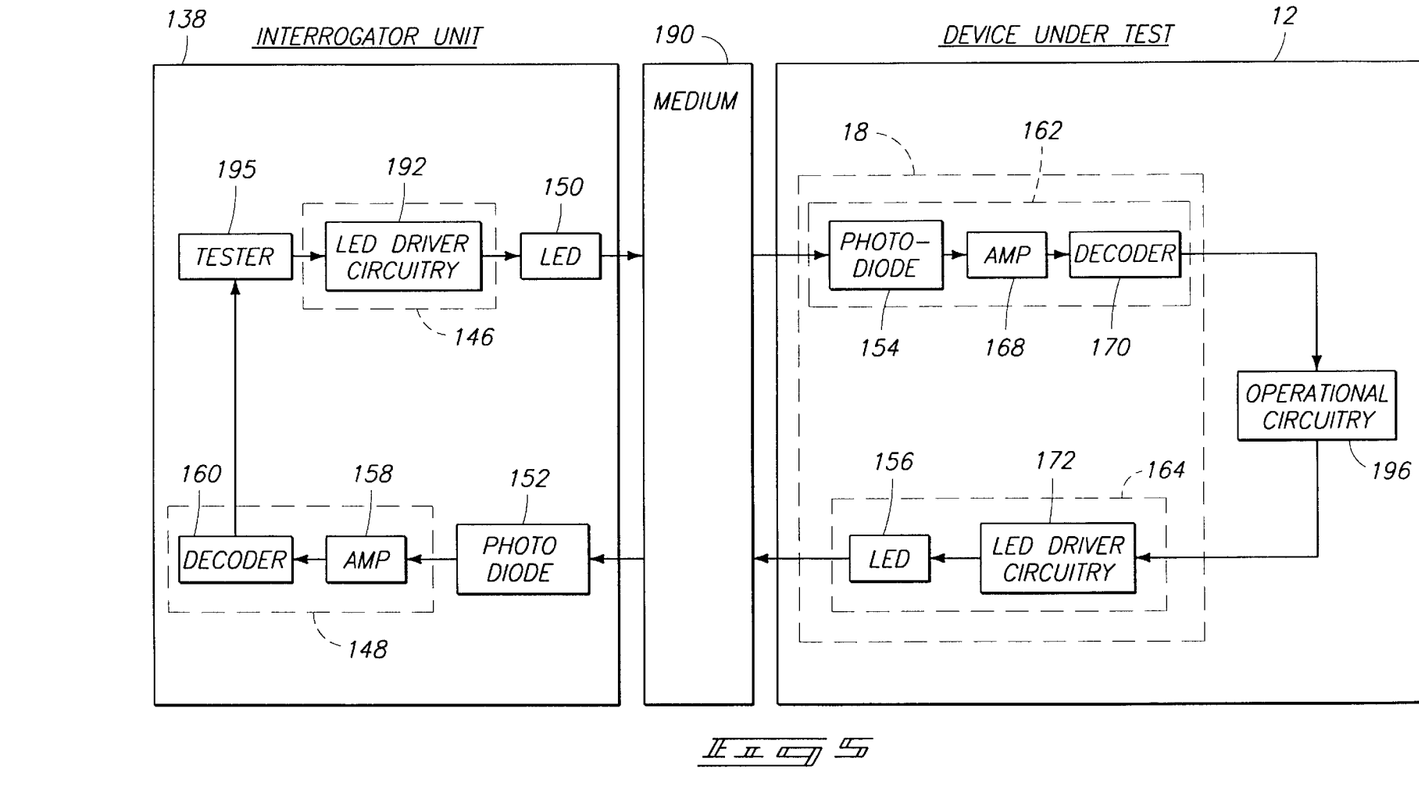
FIG. 5 is a block diagram of electrical components of the testing system of FIG. 2 in accordance with an alternative embodiment of the invention.

FIG. 5 is an alternative embodiment that is similar to the embodiment of FIG. 4, like reference numerals indicating like components, except that in the embodiment of FIG. 5, individual devices under test 12 include the test interface circuitry 18. More particularly, individual devices under test 12 include a data transmitter 164 and a data receiver 162 coupled to operational circuitry 196.

Figure 6:
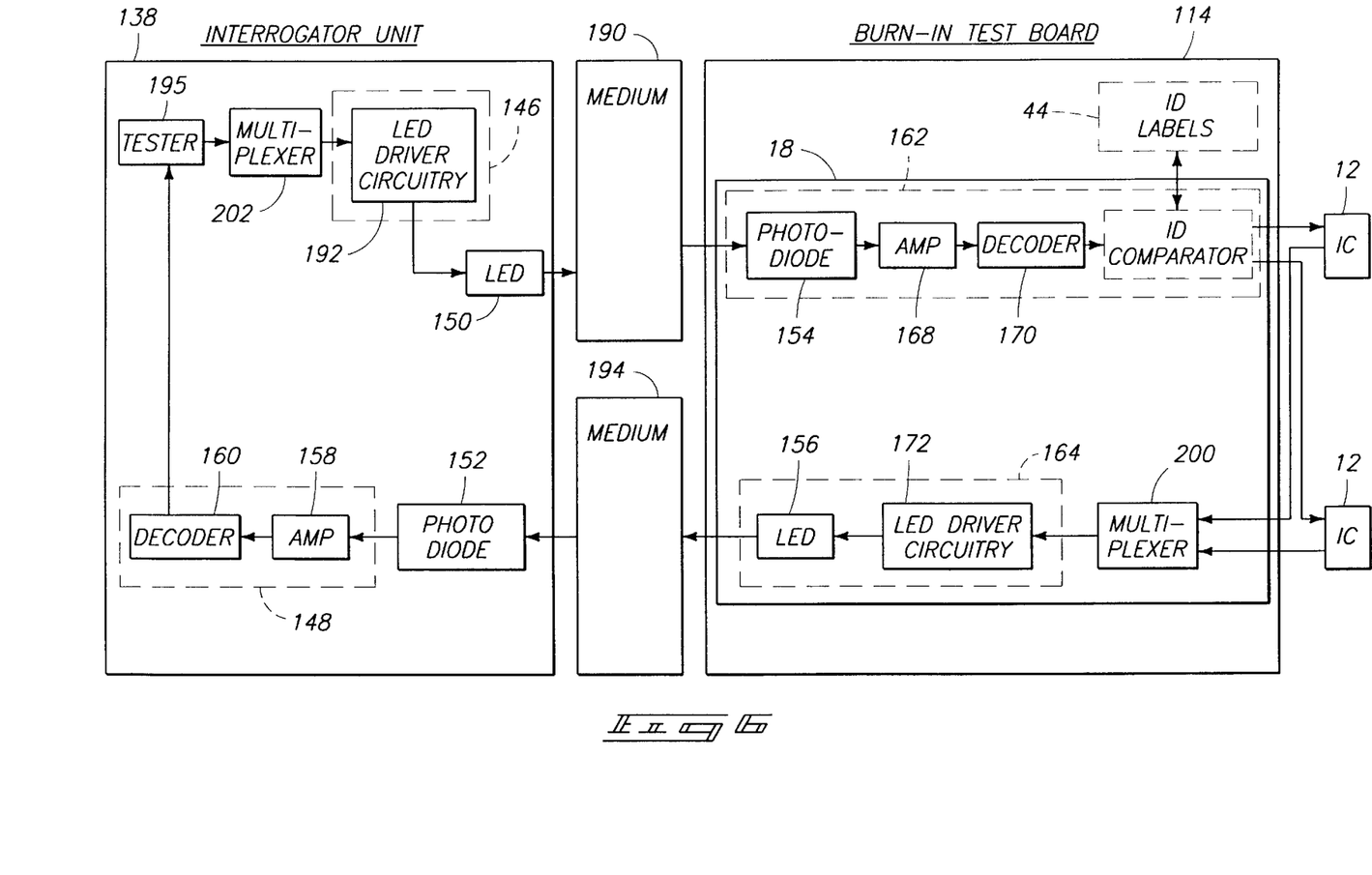
FIG. 6 is a block diagram illustrating of electrical components of the testing system of FIG. 2 in accordance with another alternative embodiment of the invention.

FIG. 6 is another alternative embodiment that is similar to the embodiment of FIG. 4, except that it includes a multiplexor 200 for multiplexing test data from multiple devices under test 12. In one embodiment, the interrogator also includes a multiplexer 202 for multiplexing interrogating data for respective devices under test 12.

Using any of the embodiments described above, operational circuitry included in respective devices under test 12 is subjected to various tests which are designed to determine whether devices under test 12 are defective. The test results are transmitted from the devices under test 12 back to the interrogator unit and examined. If a device under test 12 has a defect, it is marked and removed from the other devices under test 12.

Evaluating devices under test using contactless methods, such as radio frequency transmission or light transmission, provide a number of advantages. First, the devices under test 12 can be tested without having to make electrical contact with each chip. A second advantage is that more chips can be evaluated at a higher rate. During burn-in testing, for example, substantially more integrated circuits can be placed in an oven for burn-in because the testing system 10 no longer needs to contact each individual integrated circuit. This improves testing efficiency. A third advantage is that precise electrical connection to tiny contacts on every integrated circuit is not required for testing. A fourth advantage is that parametric and/or live circuit information which is being generated under harsh environmental conditions can be monitored in real time without using contacts.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A burn-in testing system for evaluating a circuit under test, the system comprising:
    a burn-in board having a plurality of receptacles, at least one of which is configured to receive the circuit under test and to supply power thereto;
    test inferface circuitry coupled to the receptacles, the test interface circuitry including a transmitter and a receiver; and
    an interrogator unit having a radio communication range extending to the test interface circuitry, the interrogator unit being configured to send commands via radio communication through the receiver to the test inter­face circuitry to exercise the circuit under test and to receive responses to the commands from the transmitter via radio communication.

2. A burn-in testing system in accordance with claim 1, wherein the test interface circuitry is mounted to the burn-in board.

3. A burn-in testing system in accordance with claim 1, further comprising power conductors supported by the burn-in board, coupled to the receptacles and configured to be coupled to a power supply to power the circuit under test during burn-in testing, wherein the power conductors comprise conductive traces formed on the burn-in board.

4. A burn-in testing system in accordance with claim 1, further comprising data lines supported by the burn-in board, coupled between the receptacles and the test interface circuitry and configured to exchange information between the test interface circuitry and the circuit under test.

5. A burn-in testing system in accordance with claim 1, further comprising conductive traces formed on the burn-in board and configured to couple the receptacles to the test interface circuitry.

6. A burn-in testing system in accordance with claim 1, wherein the circuit under test includes operational circuitry, and wherein the test interface circuitry cycles the operational circuitry according to the commands from the interrogator unit.

7. A burn-in testing system in accordance with claim 6, wherein the interrogator unit is configured to provide an identification code as part of the interrogating information, wherein the test interface circuitry includes ID labels assigned to respective receptacles, and wherein the test inferface circuitry is configured to compare the identification code provided by the interrogator unit with the ID label of a receptacle of the plurality of receptacles corresponding to the circuit under test, the test interface circuitry being configured to test cycle the operational circuitry when the identification code matches the ID label.

8. A burn-in testing system in accordance with claim 1, wherein the test interface circuitry is separately coupled to respective ones of the plurality of receptacles such that the interrogator, in communication with the test interface circuitry, can select the circuit under test for test cycling.

9. A burn-in testing system in accordance with claim 1, wherein ones of the plurality of receptacles respectively comprise sockets configured to receive an integrated circuit comprising the circuit under test.

10. A burn-in testing system in accordance with claim 1, wherein at least one of the plurality of receptacles is configured to receive an integrated circuit defining the circuit under test.

11. A testing system for evaluating integrated circuits, the testing system comprising:
    an interrogator unit having a transmitter having a radio communication range and configured to transmit interrogating information via radio communication;
    receiver configured for communications with the transmitter; and
    a burn-in board remote from the interrogator unit, but within the radio communication range, the burn-in board including a plurality of receptacles configured to receive respective individual integrated circuits and to supply power thereto, the burn-in board having burn-in test conductors coupling the receiver to respective ones of the plurality of receptacles, the plurality of receptacles including sockets configured to electrically couple the respective integrated circuits to the burn-in test conductors.

12. A testing system in accordance with claim 11, further comprising test interface circuitry supported by the burn-in board, the test interface circuitry including the receiver.

13. A testing system in accordance with claim 12, wherein the test interface circuitry is formed on the burn-in board.

14. A testing system in accordance with claim 12, wherein the test interface circuitry is configured to be separately coupled to the respective ones of the plurality of receptacles for individualized testing of integrated circuits.

15. A testing system in accordance with claim 11, wherein the testing system is configured to perform dynamic testing.

16. A testing system in accordance with claim 11, wherein the testing system is configured to perform dynamic testing and wherein the integrated circuits are cycled on and off during a period of time greater than twelve hours and less than thirty-six hours.

17. A testing device in accordance with claim 11, further comprising a test chamber including a burn-in over, wherein the testing system is configured to perform dynamic testing including cycling the integrated circuits on and off during a period of time greater than twelve hours and less than thirty-six hours while the oven heats the chamber to a temperature greater than 100 degrees Celsius.

18. A testing system in accordance with claim 11, further comprising a test chamber including a burn-in oven, wherein the testing system is configured to perform dynamic testing including cycling the integrated circuits on and off during a period of time of at least twelve hours while the oven heats the chamber to a temperature greater than 100 degrees Celsius.

19. A testing system in accordance with claim 11, wherein the testing system is configured to perform static testing.

20. A testing system in accordance with claim 11, further comprising power conductors configured to couple respective ones of the plurality of receptacles to a power source to supply power to the integrated circuits during burn-in testing wherein the power conductors extend at least partially along the burn-in board.

21. A testing system in accordance with claim 11, further comprising:

power conductors formed on the burn-in board and configured to couple respective ones of the plurality of receptacles to a power source to supply power to the integrated circuits during burn-in testing;

a burn-in oven configured to heat the test chamber during burn-in testing; and a power source accessible from the test chamber, wherein the power conductors are configured to be removably coupled to the power source.

22. A testing system in accordance with claim 11, further comprising:

power conductors formed on the burn-in board and configured to supply power to the integrated circuits during burn-in testing; and a power source to which the power conductors are selectively coupled, the power source being configured to supply to the integrated circuits a voltage higher than a normal operating voltage of the respective integrated circuits.

23. A burn-in testing system for evaluating a circuit under test, the system comprising:

a burn-in board having a plurality of receptacles configured to respectively receive the circuit under test;

test interface circuitry coupled to the receptacles, the test interface circuitry including a first optical coupler; and an interrogator unit including a second optical coupler and being configured to optically send commands to the test interface circuitry, via the second optical coupler, to test the circuit under test and to optically receive responses to the commands, via the second optical coupler.

24. A burn-in testing system in accordance with claim 23, wherein at least one of the plurality of receptacles is configured to receive an integrated circuit.

25. A burn-in testing system in accordance with claim 23, further comprising a fiber optic cable configured to couple the interrogator unit to the test interface circuitry.

26. A testing system for evaluating integrated circuits, the testing system comprising:

an interrogator unit having an optical transmitter having an optical communication range, the interrogator unit being configured to optically transmit interrogating information;

an optical receiver configured to communicate with the optical transmitter; and a burn-in board included within the optical communication range, the burn-in board including a plurality of receptacles configured to receive respective individual integrated circuits and to supply power thereto, the burn-in board supporting the optical receiver, the burn-in board having burn-in test conductors configured to couple the optical receiver to respective receptacles, the receptacles including sockets configured to electrically couple the respective integrated circuits to the burn-in test conductors.

27. A testing system in accordance with claim 26, further comprising test interface circuitry supported by the burn-in board, the test interface circuitry including the optical receiver.

28. A method for testing an integrated circuit including operational circuitry, the method comprising:

providing test interface circuitry and a plurality of receptacles configured to electrically interface the test interface circuitry with the operational circuitry in the integrated circuits and to supply power thereto;

providing an interrogator unit;

placing the integrated circuit in one of the plurality of receptacles;

heating the integrated circuit;

transmitting interrogating information from the interrogator unit to the test interface circuitry via radio communication;

testing the operational circuitry according to the interrogating information;

coupling test data from the operational circuitry to the interrogator unit; and determining whether the integrated circuit has a defect.

29. A method in accordance with claim 28, further comprising:

marking respective ones of the plurality of receptacles with individual ID labels;

transmitting an identification code from the interrogator unit;

comparing the identification code with the ID label; and test cycling the operational circuitry of an integrated circuit in a given receptacle only when the identification code matches the individual ID label of the given receptacle.

30. A method for testing an integrated circuit including operational circuitry, the method comprising:

providing test interface circuitry and a plurality of receptacles configured to receive integrated circuits and to electrically interface the operational circuitry in the integrated circuits with the test interface circuitry and to supply power thereto;

providing an interrogator unit;

placing the integrated circuit in one of the receptacles;

optically transmitting interrogating information from an optical transmitter having an optical communication range and contained in the interrogator unit to the test interface circuitry;

testing the operational circuitry according to the interrogating information;

optically transmitting test data output by the operational circuitry back to the interrogator unit; and determining from the test data whether the integrated circuit has a defect.

31. A method in accordance with claim 30, further comprising:

marking respective ones of the plurality of receptacles with individual ID labels;

transmitting an identification code from the interrogator unit;

comparing the identification code with the individual ID labels; and test cycling the operational circuitry of an integrated circuit in a given receptacle only when the identification code matches the individual ID label of the given receptacle.

32. A method in accordance with claim 30, further comprising heating the integrated circuit during testing.

33. A method for testing an integrated circuit including operational circuitry, the method comprising:

providing test interface circuitry and a plurality of receptacles configured to receive integrated circuits and to electrically interface the operational circuitry in the integrated circuits with the test interface circuitry and to supply power thereto;

providing an interrogator unit;

placing the integrated circuit in one of the receptacles;

transmitting interrogating information from the interrogator unit to the test interface circuitry via radio communication; and testing the operational circuitry according to the interrogating information.

34. A method for testing an integrated circuit including operational circuitry, the method comprising:

providing test interface circuitry and a plurality of receptacles configured to receive integrated circuits, to electrically interface the operational circuitry in the integrated circuits with the test interface circuitry and to supply power thereto;

providing an interrogator unit;

placing the integrated circuit in one of the receptacles;

optically transmitting interrogating information from an optical transmitter having an optical communication range in the interrogator unit to the test interface circuitry; and testing the operational circuitry according to the interrogating information.

35. A method for testing an integrated circuit including operational circuitry, comprising:

providing an interrogator unit;

coupling the integrated circuit to test interface circuitry via a receptacle, the receptacle supplying power to the integrated circuit;

transmitting interrogating information from the interrogator unit to the test interface circuitry via radio communication; and testing the operational circuitry according to the interrogating information.

36. A method in accordance with claim 35, further comprising:

marking the receptacle with an ID label;

transmitting an identification code from the interrogator unit;

comparing the identification code with the ID label; and testing the operational circuitry of the integrated circuit in the receptacle only when the identification code matches the ID label of the receptacle.

37. A method for testing an integrated circuit including operational circuitry, comprising:

providing an interrogator unit;

placing the integrated circuit in a receptacle coupled to test interface circuitry, the receptacle supplying power to the integrated circuit;

optically transmitting interrogating information from an optical transmitter having an optical communication range contained in the interrogator unit to the test interface circuitry on the burn-in board; and testing the operational circuitry according to the interrogating information.

38. A method in accordance with claim 37, further comprising heating the integrated circuit.

39. A burn-in testing system for evaluating a circuit under test, comprising:

a burn-in board configured to receive and supply electrical power to the circuit under test;

test interface circuitry configured to be coupled to the circuit under test, the test interface circuitry including a transmitter and receiver; and an interrogator unit having a radio communication range extending to the test interface circuitry, the interrogator unit being configured to exchange signals with the circuit under test via radio communication with the transmitter and receiver.

40. A burn-in testing system in accordance with claim 39, wherein the test interface circuitry is mounted on the burn-in board.

41. A burn-in testing system in accordance with claim 39, further comprising a plurality of receptacles on the burn-in board and configured to receive the circuit under test, and coupled to the test interface circuitry.

42. A burn-in testing system in accordance with claim 41, further comprising conductive traces on the burn-in board coupling the receptacles to the test interface circuitry.

43. A burn-in testing system in accordance with claim 41, further comprising power conductors supported by the burn-in board, configured to be coupled to the circuit under test and configured to be coupled to a power supply to power the circuit under test during burn-in testing, the power conductors comprising conductive traces formed on the burn-in board.

44. A testing system for evaluating integrated circuits, comprising:

an interrogator unit having a transmitter having a radio communication range, the interrogator unit being configured to transmit interrogating information via radio communication;

a receiver configured for communications with the transmitter; and a burn-in board within the radio communication range, the burn-in board being configured to support respective individual integrated circuits, the burn-in board supporting the receiver, the burn-in board having burn-in test conductors configured to couple the receiver to respective integrated circuits and to supply electrical power to the integrated circuits.

45. A testing system in accordance with claim 44, further comprising test interface circuitry supported by the burn-in board, the test interface circuitry including the receiver.

46. A testing system in accordance with claim 45, the testing system being configured to perform dynamic testing.

47. A testing system in accordance with claim 45, the testing system being configured to perform dynamic testing wherein the integrated circuits are cycled on and off during a period of time greater than twelve hours and less than thirty-six hours.

48. A testing system in accordance with claim 45, wherein the testing system includes a burn-in oven and the testing system is configured to perform dynamic testing wherein the integrated circuits are cycled on and off during a period of time of at least twelve hours while the burn-in oven heats the chamber to a temperature greater than 100 degrees Celsius.

49. A testing system in accordance with claim 45, wherein the test interface circuitry is secured to the burn-in board.

50. A testing system in accordance with claim 45, wherein the testing system is configured to perform static testing.

51. A testing system in accordance with claim 45, wherein the test interface circuitry is separately coupled to the respective receptacles and is configured for individualized testing of the integrated circuits.

52. A testing system in accordance with claim 44, further comprising power conductors formed on the burn-in board and configured to couple respective integrated circuits to a power source to supply power to the integrated circuits during burn-in testing, the power conductors extending at least partially along the burn-in board.

53. A testing system in accordance with claim 52, further including a burn-in oven configured to heat the integrated circuits during testing and wherein the power conductors are configured to be removably coupled to the power source.

54. A testing system in accordance with claim 44, further comprising a power source to which power conductors are selectively coupled, the power source being configured to supply the integrated circuits a voltage higher than a normal operating voltage of the respective integrated circuits.

* * * * *

UNITED STATES PATENT AND TRADEMARK OFFICE
CERTIFICATE OF CORRECTION

PATENT NO.    : 6,349,396 B2
DATED         : February 19, 2002
INVENTOR(S)   : Salman Akram It is certified that error appears in the above-identified patent and that said Letters Patent is hereby corrected as shown below:

Column 8,
Line 21, replace "64 is received via the antenna 66," with -- 56 is received via the antenna 66, --

Column 11,
Line 26, replace "test inferface circuitry coupled" with -- test interface circuitry coupled --
Line 64, replace "inferface circuitry is configured" with -- interface circuitry is configured --

Column 12,
Line 21, replace "receiver configured for communications" with -- a receiver configured for communications --
Line 50, replace "including a burn-in over, wherein" with -- including a burn-in oven, wherein --

Signed and Sealed this

Fourteenth Day of January, 2003

JAMES E. ROGAN
*Director of the United States Patent and Trademark Office*